United States Patent
Chaudhuri et al.

(10) Patent No.: US 6,660,560 B2
(45) Date of Patent: Dec. 9, 2003

(54) NO-FLOW UNDERFILL MATERIAL AND UNDERFILL METHOD FOR FLIP CHIP DEVICES

(75) Inventors: Arun K. Chaudhuri, Carmel, IN (US); Derek B. Workman, Noblesville, IN (US); Matthew R. Walsh, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 31 days.

(21) Appl. No.: 09/949,556

(22) Filed: Sep. 10, 2001

(65) Prior Publication Data

US 2003/0049411 A1 Mar. 13, 2003

(51) Int. Cl.[7] .................. H01L 21/44; H01L 21/48; H01L 21/50; H01L 23/48; H01L 23/52; H01L 29/40; H01L 23/29

(52) U.S. Cl. .................. 438/108; 438/118; 257/778; 257/795

(58) Field of Search .................. 438/109, 108, 438/118; 257/778, 795

(56) References Cited

U.S. PATENT DOCUMENTS

2001/0017414 A1 * 8/2001 Gilleo .................. 257/737
2002/0056906 A1 * 5/2002 Kajiwara et al. .......... 257/697
2002/0109228 A1 * 8/2002 Buchwalter et al. ........ 257/738

* cited by examiner

Primary Examiner—Wael Fahmy
Assistant Examiner—Nema Berezny
(74) Attorney, Agent, or Firm—Jimmy L. Funke; Stefan V. Chmielewski

(57) ABSTRACT

A no-flow underfill material and process for underfilling a flip chip component. The underfill material comprises at least three polymer layers. A first of the layers overlies terminals of a substrate to which the component is to be mounted. The first and second layers are substantially free of fillers, while the third layer contains a filler material to reduce its CTE. The underfill process entails placing the component so that solder terminals thereof penetrate the first, second and third layers and contact the terminals on the substrate. Because only the third layer contains filler material, penetration of the underfill material by the solder terminals is substantially unimpeded. The solder terminals are then reflowed, during which the filler material migrates into the unfilled first layer and the first, second and third layers consolidate and cure to form a single underfill layer.

11 Claims, 2 Drawing Sheets

NO-FLOW UNDERFILL MATERIAL AND UNDERFILL METHOD FOR FLIP CHIP DEVICES

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to underfill materials for flip chip devices. More particularly, this invention relates to a no-flow material for underfilling a flip chip device and an underfill method using the no-flow material.

(2) Description of the Related Art

Underfilling is well known for promoting the reliability of flip chip components, such as flip chips and ball grid array (BGA) packages that are physically and electrically connected to traces on organic or inorganic circuit boards with numerous solder bump connections. The underfill process generally involves using a specially formulated dielectric material to completely fill the void between the component and the circuit board and encapsulate the solder bump connections of the component. In conventional practice, underfilling takes place after the component is attached to the circuit board. The underfill material is placed along the perimeter of the component, and capillary action is relied on to draw the material beneath the component. For optimum reliability, the composition of the underfill material and the underfill process parameters must be carefully controlled so that voids will not occur in the underfill material beneath the component, and to ensure that a uniform fillet is formed along the entire perimeter of the component.

In addition to the flow properties necessary to achieve the required capillary action, the underfill materials must also have a suitable coefficient of thermal expansion (CTE) relative to that of the solder connections, component and circuit board. Dielectric materials having suitable flow and processing characteristics are typically thermosetting polymers such as epoxies, to which a fine particulate filler material such as silica is added to lower the CTE of the underfill material from that of the polymer to something that is more compatible with the CTE's of the component, circuit board, and the solder composition of the solder connections. An acceptable CTE for underfill materials is typically about 18 to 32 ppm/° C. As known in the art, an acceptable CTE match is necessary to reduce thermal fatigue of the solder connections. In order for the underfill material to be sufficiently flowable during the underfill process, the filler material typically has an average particle size of less than 10 micrometers. Suitable fill levels and compositions for the filler material are dependent on the particular polymer used and the amount and size of filler material necessary to achieve the desired CTE.

Highly-filled capillary-flow underfill materials are widely used in flip chip assembly processes. However, to achieve acceptable levels of manufacturability with these underfill materials, expensive process steps are typically required to repeatably produce void-free underfills. These limitations can limit the versatility of the flip chip underfill process to the extent that capillary-flow underfilling is not practical for many flip chip applications, particularly flip chips with fine pitch solder connections and low standoff heights. As a result, materials and processes are continuously sought as alternatives to underfill materials that rely on capillary action. As an example, the use of no-flow adhesives has been considered, particularly for flip chip assembly. Because of the no-flow characteristic, underfilling with a no-flow adhesive requires that the underfill is deposited as a thin layer over the trace or bond pad pattern for the flip chip component. A sufficient amount of the adhesive must be deposited that will be capable of forming a fillet around the chip without floating the chip. The chip is then placed and pressed downward so that the solder bumps contact their respective bond pads through the underfill material, after which the underfill material is cured concurrently with solder reflow. Contrary to capillary-flow underfill materials, filler materials are not typically added to no-flow underfill materials because of the tendency for the filler material to hinder the flip chip assembly process. For example, the filler material impedes the penetration of the underfill material by the solder bumps, and filler particles can become trapped between the solder bumps and the bond pads to interfere with the formation of a metallurgical bond and reduce the reliability of the electrical connection. Without a filler material to reduce their CTE, no-flow underfill materials have not been practical for use in harsh environments, such as automotive applications for flip chips on laminate circuit boards.

In view of the above, it would be desirable if an underfill material and process were available that were capable of achieving the product reliability obtained with capillary-flow underfill materials and processes, but without the cost and processing limitations of these materials.

BRIEF SUMMARY OF THE INVENTION

The present invention provides a no-flow underfill material and process suitable for underfilling flip chips employed in harsh environments. The underfill material and process are adapted to incorporate a filler material in a manner that does not compromise component placement, solder connection and reliability, and therefore are suitable for use in underfill applications that have previously required capillary-flow underfill materials.

The no-flow underfill material of this invention is used in the form of a structure that comprises at least three layers. A first of the layers is formed of an uncured first polymer dielectric material and is intended to overlie the bond pads, traces or other terminal structures of the circuit substrate to which a flip chip is to be attached. A second layer of an uncured second polymer dielectric material overlies the first layer, and a third layer of an uncured third polymer dielectric material overlies the second layer. The first and second polymer dielectric materials are substantially free of fillers that would lower their CTE's, while the third polymer dielectric material contains a filler material that has the effect of reducing the CTE of the third polymer dielectric material. In this arrangement, the unfilled first layer is nearest the bond pads, and the unfilled second layer serves as a buffer between the filled third (outermost) layer and the unfilled first (innermost) layer.

The underfill process of this invention entails providing the no-flow underfill structure on the surface region on which a flip chip is to be placed, including each bond pad to be mated with a solder bump (or other suitable reflowable terminal) and the region surrounded by the bond pads. The flip chip is then placed so that its solder bumps successively penetrate the third, second and first layers and contact their respective bond pads. Because only the third (outermost) layer of the underfill structure contains filler material, penetration of the underfill structure by the solder bumps is substantially unimpeded. Any displacement of the filler material from the first layer is generally limited to filler particles being pushed into the unfilled second layer, so that the first layer remains substantially free of filler material. An appropriate heating step is then performed by which the solder bumps are reflowed and the underfill material cured. During this step, the filler material in the third layer migrates into the unfilled first and second layers, and the first, second and third layers consolidate and cure to form a single underfill layer with a substantially uniform dispersion of the filler material. As a result of the heating step, the solder bumps form solid electrical interconnects that are individually metallurgically bonded to the bond pads through the underfill layer.

According to a preferred aspect of the invention, the underfill layer is continuous and void-free, encapsulates the solder interconnects, and completely fills the volume between the flip chip component and the circuit substrate. Because the no-flow underfill material incorporates a filler material to reduce its CTE to something close to that of the solder connections it protects, the underfill material and process of this invention are capable of achieving the product reliability previously possible only with the use of capillary-flow underfill materials and processes, but without the processing costs and limitations associated with capillary-flow underfill materials.

Other objects and advantages of this invention will be better appreciated from the following detailed description.

DETAILED DESCRIPTION OF THE INVENTION

Figure 1:
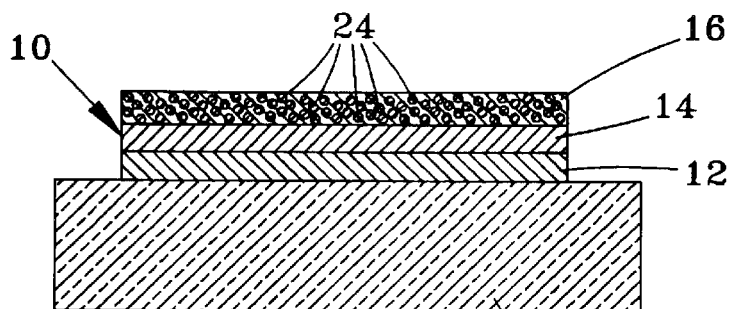
FIG. 1 represents a no-flow underfill structure in accordance with a preferred embodiment of the present invention.
Figure 2:
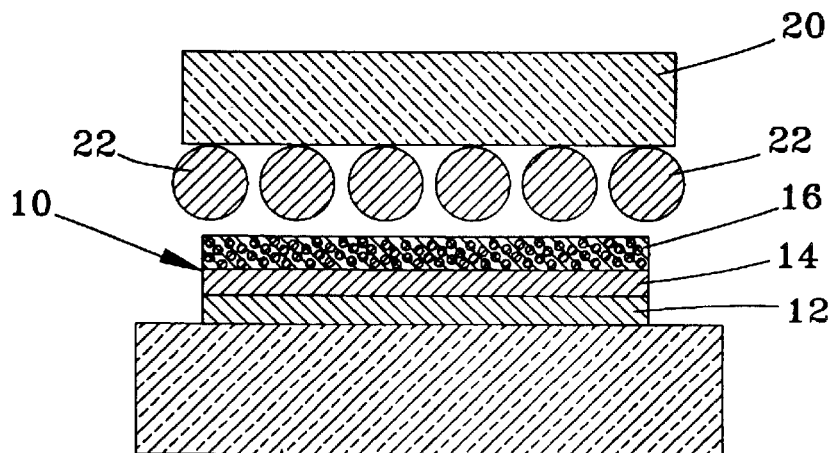
FIG. 2 represents the step of placing a flip chip so that solder bumps on the flip chip penetrate the underfill structure.
Figure 7:
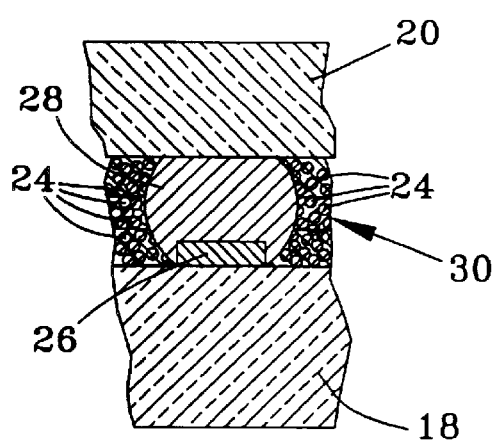

A no-flow underfill material 10 in accordance with a preferred embodiment of the present invention is schematically represented in FIG. 1 as forming a structure comprising three discrete layers 12, 14 and 16, though will ultimately form an underfill layer 30 for a flip chip 20 as represented in FIG. 7. The underfill material 10 is shown on a substrate 18, which may be a circuit board formed of various materials, such as a thin laminate printed wiring board (PWB), or any other suitable circuit board material known in the art. As shown in FIG. 2, the flip chip 20 is to be attached to the substrate 18 with solder bumps 22, for which purpose the substrate 18 is provided with bond pads or other suitable terminals (not shown) for registration with the solder bumps 22. While the underfill material 10 is represented as having three layers 12, 14 and 16, additional layers could be incorporated into the structure, as will become apparent with the following discussion.

The three layers 12, 14 and 16 of the underfill material 10 of this invention have different compositions based on their respective locations within the underfill material 10. Each layer 12, 14 and 16 is formed of a dielectric polymer material. The polymer materials of the layers 12, 14 and 16 may differ from each other, but must be compositionally and physically compatible with each other, and have similar cure temperatures. A primary difference between the layers 12, 14 and 16 is that the outermost layer 16 is formulated to contain a filler material 24, while the innermost layer 12 (contacting the substrate 18) and the intermediate layer 14 do not. The filler material 24 is chosen in part on the basis of having a coefficient of thermal expansion (CTE) that is different from that of the polymer material of the layer 16, with the effect of reducing the overall CTE of the layer 12 to something closer to the CTE's of the substrate 18, flip chip 20 and solder bumps 22. As a result of the presence of the filler material 24, the outermost layer 16 will also typically have a significantly higher viscosity than the innermost and intermediate layers 12 and 14. The innermost layer 12 contacts the surface of the substrate 18 and therefore must be capable of bonding the underfill material 10 to the substrate 18. Because the innermost layer 12 also contacts the terminals to which the solder bumps 22 are to be reflow soldered, the innermost layer 12 preferably contains a fluxing compound to crack, displace and/or reduce oxides on the solder bumps 22 and terminals that would otherwise interfere with the ability of these features to metallurgically bond to each other.

Particularly suitable materials for the innermost layer 12 include epoxy adhesives containing about 13 to about 25 weight percent, preferably about 18 to about 20 weight percent, of a fluxing compound. An example of a suitable adhesive material for the innermost layer 12 is commercially available from 3M under the name UF3400. This material is essentially an epoxy adhesive with a cure temperature of about 220° C. and a glass transition temperature of about 150° C. Particularly suitable matrix materials for the intermediate and outermost layers 14 and 16 also include epoxy adhesives, and have glass transition temperatures in a range of about 100 to about 150° C., depending on the particular application. The outermost layer 16 further contains enough filler material 24 that will be subsequently capable of bringing the CTE of the final underfill layer 30 into an acceptable range. For example, the outermost layer 16 may contain about 50 to about 70 weight percent silica particles. The filler material 24 may also be silicon nitride ($Si_3N_4$), silicon carbide (SiC), aluminum nitride (AlN), boron nitride (BN), or various other materials with suitably low CTE's. An example of a suitable adhesive material for the intermediate and outermost layers 14 and 16 is the aforementioned UF3400 epoxy adhesive. As those skilled in the art will appreciate, the molecular weights of the adhesives for the layers 12, 14 and 16 can be varied to adjust viscosities.

Figure 3:
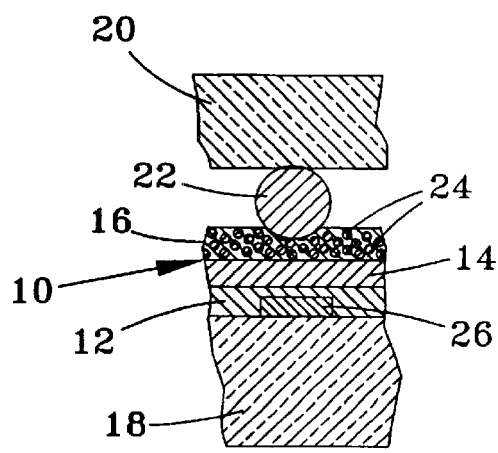
FIGS. 3 through 7 represent a sequence of steps during the penetration of the underfill material by a solder bump of the flip chip in accordance with the preferred embodiment of the invention.
Figure 4:
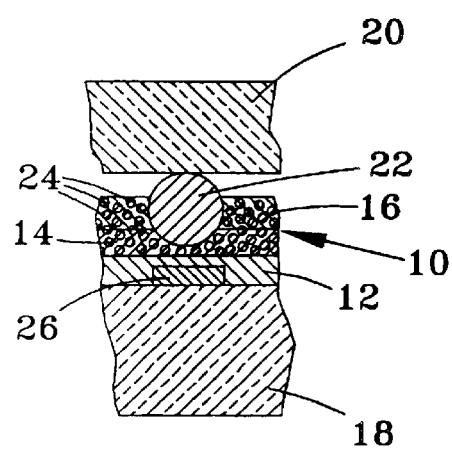
Figure 5:
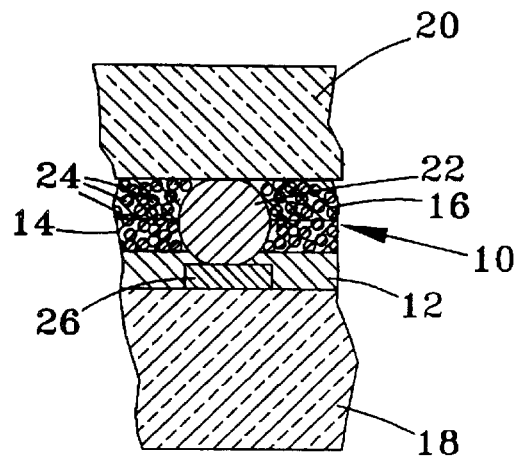
Figure 6:
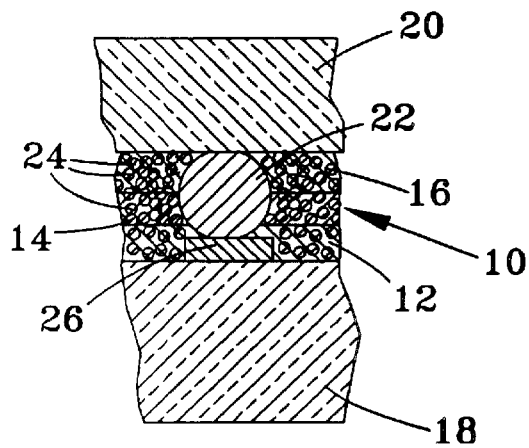

As is apparent from FIG. 2, when assembling the flip chip 20 with the substrate 18, the solder bumps 22 must penetrate the underfill material 10 to make contact with their respective bond pads. The sequence of this operation is shown in greater detail in FIGS. 3 through 7, which illustrate the penetration of a single solder bump 22 of the flip chip 20 until contact is made with a trace 26 on the surface of the substrate 18. To facilitate this operation, the substrate 18 with the underfill material 10 in place may be slightly warmed to lower the viscosities of the layers 12, 14 and 16. If the preferred materials are used for these layers 12, 14 and 16, a suitable warming temperature is believed to be about 70 to about 90° C. At these temperatures, slight movement of the filler material 24 from the outermost layer 16 toward the innermost layer 12 may occur, particularly as the solder bump 22 successively penetrates the layers 16, 14 and then 12, as shown in the sequence of FIGS. 3 through 5. Migration of the filler material 24 into the innermost layer 12 is minimized if not prevented by forming the intermediate layer 14 of a polymer whose viscosity is higher than that of the innermost layer 12, and also preferably lower than that of the outermost layer 16. In this manner, the intermediate layer 14 serves as the depository of the particles of the filler material 24 that have escaped the outermost layer 16, such that the filler material 24 does not significantly hinder the penetration of the underfill material 10 by the solder bumps 22, as evident from FIG. 5.

Once the underfill material 10 is penetrated and the solder bumps 22 contact their respective traces 26, the assembly undergoes a conventional reflow process to melt and coalesce the solder bumps 22, which upon cooling form solder connections 28 that are metallurgically bonded to their traces 26. During reflow, which would be performed at a temperature of at least 183° C. and typically about 210° C. to about 225° C. if the solder bumps 22 are formed of the eutectic tin-lead solder, the layers 12, 14 and 16 gradually commingle (FIG. 6) to form a single underfill layer 30 (FIG. 7) that surrounds the molten solder bump 22 and contacts both the lower surface of the flip chip 20 and the upper surface of the substrate 18. During this process and prior to complete curing of the underfill layer 30, the particles of the filler material 24 migrate from the outermost layer 16 into the innermost and intermediate layers 12 and 14, creating a relatively uniform dispersion of the filler material 24 throughout the underfill layer 30 to lower the overall CTE of the underfill layer 30 to something closer to the CTE of the solder connection 28, a suitable example of which would be a CTE range of about 18 to about 32 ppm/° C. for the underfill 30. Upon cooling the assembly, the cured underfill layer 30 encapsulates the solder connection 28 and is bonded to the substrate 18 and flip chip 20.

In view of the above, one can appreciate that the underfill layer 30 formed by the no-flow underfill material 10 and process of this invention has a CTE that is sufficiently close to that of the solder connections 28 to improve the reliability of the flip chip assembly, while having a simplified manufacturing process and a reduced number of process steps as compared to capillary-flow underfill materials. As a result, the no-flow underfill material 10 and process of this invention enable CTE matching in a wider variety of flip chip applications than capillary-flow underfill materials and processes.

While the invention has been described in terms of a preferred embodiment, it is apparent that other forms could be adopted by one skilled in the art. Accordingly, the scope of the invention is to be limited only by the following claims.

What is claimed is:

1. A method of underfilling a flip chip component with a no-flow underfill material, the method comprising the steps of:
    forming the no-flow underfill material to comprise a first layer of an uncured first polymer dielectric material on a terminal of a circuit substrate, a second layer of an uncured second polymer dielectric material on the first layer, and a third layer comprising an uncured third polymer dielectric material on the second layer, the first and second layers being substantially free of a particulate filler, the third layer containing a particulate filler material having a CTE lower than the CTE of the third polymer dielectric material;
    penetrating the first, second and third layers with a solder terminal of the flip chip component so that the solder terminal contacts the terminal;
    heating the first, second and third layers and the solder terminal so that the solder terminal melts, the particulate filler material in the third layer migrates into the first layer, and the first, second and third layers consolidate and cure to form a single underfill layer, and then
    cooling the molten solder terminal and the underfill layer so that the molten solder terminal forms a solid electrical interconnect that is metallurgically bonded to the terminal and the underfill layer encapsulates the interconnect and contacts both the flip chip component and the circuit substrate.

2. The method according to claim 1, wherein the second and third polymer dielectric materials have the same composition.

3. The method according to claim 1, wherein the first layer further contains a fluxing compound.

4. The method according to claim 1, wherein the particulate filler material is selected from the group consisting of silica, silicon nitride, silicon carbide, aluminum nitride and boron nitride.

5. The method according to claim 1, wherein the second polymer dielectric material has a higher viscosity than the first polymer dielectric material, and the first layer remains substantially free of particulate filler material immediately after the penetrating step.

6. The method according to claim 5, wherein the third polymer dielectric material has a higher viscosity than the second polymer dielectric material.

7. The method according to claim 1, wherein the underfill layer has a CTE of about 18 to about 32 ppm/° C.

8. A method of underfilling a flip chip with a no-flow underfill material, the method comprising the steps of:
    depositing a first layer of an uncured first adhesive material on a terminal of a circuit substrate, the first layer containing a flux compound but being substantially free of a particulate filler having a CTE lower than the CTE of the first adhesive material;
    depositing a second layer of an uncured second adhesive material on the first layer, the second adhesive material having a higher viscosity than the first adhesive material, the second layer being substantially free of a particulate filler having a CTE lower than the CTE of the second adhesive material;
    depositing a third layer of an uncured third adhesive material on the second layer, the third adhesive material having a higher viscosity than the second adhesive material, the third layer containing a particulate filler material having a GTE lower than the CTE's of the first, second and third adhesive materials; penetrating the first, second and third layers with a solder bump of the flip chip so that the solder bump contacts the terminal;
    heating the first, second and third layers and the solder bump so that the solder bump melts, the particulate filler material in the third layer migrates into the first layer, and the first, second and third layers consolidate and cure to form a single underfill layer, and then
    cooling the molten solder bump and the underfill layer so that the molten solder bump forms a solid electrical interconnect that is metallurgically bonded to the terminal and the underfill layer encapsulates the interconnect and contacts both the flip chip and the circuit substrate.

9. The method according to claim 8, further comprising the step of warming the first, second and third layers prior to the penetrating step to facilitate penetration of the first, second and third layers by the solder bump, wherein the second layer accommodates substantially any of the particulate filler material that migrates from the third layer toward the first layer as a result of the warming step, and the first layer remains substantially free of particulate filler material immediately after the penetrating step.

10. The method according to claim 8, wherein the underfill layer has a GTE of about 18 to about 32 ppm/° C.

11. The method according to claim 8, wherein the particulate filler material of the third layer is selected from the group consisting of silica, silicon nitride, silicon carbide, aluminum nitride and boron nitride.

* * * * *